US 6,639,385 B2

(12) United States Patent
Verbrugge et al.

(10) Patent No.: US 6,639,385 B2
(45) Date of Patent: Oct. 28, 2003

(54) STATE OF CHARGE METHOD AND APPARATUS

(75) Inventors: Mark William Verbrugge, Troy, MI (US); Edward Dean Tate, Jr., Grand Blanc, MI (US); Damon R. Frisch, Troy, MI (US); Ramona Y. Ying, Rochester Hills, MI (US); Brian James Koch, Berkley, MI (US); Shawn D. Sarbacker, Royal Oak, MI (US)

(73) Assignee: General Motors Corporation, Detroit, MI (US)

( * ) Notice: Subject to any disclaimer, the term of this patent is extended or adjusted under 35 U.S.C. 154(b) by 0 days.

(21) Appl. No.: 10/200,604

(22) Filed: Jul. 22, 2002

(65) Prior Publication Data

US 2003/0076109 A1 Apr. 24, 2003

Related U.S. Application Data

(60) Provisional application No. 60/310,478, filed on Aug. 7, 2001.

(51) Int. Cl.$^7$ ................. H01M 10/44; H01M 10/46
(52) U.S. Cl. ........................................... 320/132
(58) Field of Search ................. 320/132, 148; 324/426, 427, 430, 433; 429/90; 702/63, 64

(56) References Cited

U.S. PATENT DOCUMENTS

| | | | | |
|---|---|---|---|---|
| 5,321,627 | A | * | 6/1994 | Reber |
| 6,359,419 | B1 | * | 3/2002 | Verbrugge et al. |
| 6,531,874 | B2 | * | 3/2003 | Mentgen et al. |
| 2002/0193953 | A1 | * | 12/2002 | Hoenig et al. |

* cited by examiner

Primary Examiner—Edward H. Tso
(74) Attorney, Agent, or Firm—Christopher DeVries

(57) ABSTRACT

A method for determining state of charge (SOC) of a battery system based upon an equivalent circuit of the battery system. A potential and resistance of the equivalent circuit are computed. The method uses a least squares regression means, and includes: providing a plurality of data points as a starting point based upon determinations including measurement or prior computation, wherein the determinations include a determination of a voltage of the battery system; weighting the plurality of data points; and computing values of the resistance and potential based upon weighted data points using recursive formulas, wherein only a state at a previous time is reflected respectively.

21 Claims, 6 Drawing Sheets

STATE OF CHARGE METHOD AND APPARATUS

CROSS REFERENCE OF RELATED APPLICATION

This application claims the benefit of U.S. Provisional application No. 60/310,478 filed Aug. 7, 2001.

TECHNICAL FIELD

This invention relates to a battery pack operating in a hybrid electrical powertrain, or a pure electric system, for a vehicle. More specifically, the present invention relates to a system and method for recursively determining a state of charge in a battery system.

BACKGROUND OF THE INVENTION

In today's automotive market, there exist a variety of propulsion or drive technologies used to power vehicles. The technologies include internal combustion engines (ICEs), electric drive systems utilizing batteries and/or fuel cells as an energy or power source, and hybrid systems utilizing a combination of internal combustion engines and electric drive systems, as well as pure electric systems. The propulsion systems each have specific technological, financial, and performance advantages and disadvantages, depending on the state of energy prices, energy infrastructure developments, environmental laws, and government incentives.

The increasing demand to improve fuel economy and reduce emissions in present vehicles has led to the development of advanced hybrid vehicles, as well as pure electric vehicles. With regard to pure electrical vehicles, no ICE is required. Electric vehicles are classified as vehicles having only one energy source, typically a battery or a hydrogen-fed fuel cell. Hybrid vehicles are classified as vehicles having at least two separate energy sources, typically gasoline to feed an internal combustion engine and a battery linked to an electric traction motor. Hybrid vehicles, as compared to standard vehicles driven by an ICE, have improved fuel economy and reduced emissions. During varying driving conditions, hybrid vehicles will alternate between separate power sources, depending on the most efficient manner of operation of each power source. For example, during most operating conditions, a hybrid vehicle equipped with an ICE and an electric motor will shut down the ICE during a stopped or idle condition, allowing the electric motor to propel the vehicle and eventually restart the ICE, improving fuel economy for the hybrid vehicle.

Hybrid vehicles are broadly classified into series or parallel drivetrains, depending upon the configuration of the drivetrains. In a series drivetrain utilizing an ICE and an electric traction motor, only the electric motor drives the wheels of a vehicle. The ICE converts a fuel source to mechanical energy to turn a generator, which converts the mechanical energy to electrical energy to drive the electric motor. In a parallel hybrid drivetrain system, two power sources such as an ICE and an electric traction motor operate in parallel to propel a vehicle. Generally, a hybrid vehicle having a parallel drivetrain combines the power and range advantages of a conventional ICE with the efficiency and electrical regeneration capability of an electric motor to increase fuel economy and lower emissions, as compared with a traditional ICE vehicle. In addition, hybrid vehicles can incorporate both series and parallel paths. Further, hybrids are often described as being either charge depleting or charge sustaining with reference to a battery pack. Charge-depleting hybrids can be charged off the electrical grid; thus, these hybrids share many of the characteristics of purely electric vehicles. In contrast, the batteries in charge-sustaining hybrids receive all of their electrical charging from the ICE.

Battery packs having secondary/rechargeable batteries are an important component of hybrid vehicle systems, as they enable an electric motor/generator (MoGen) to store braking energy in the battery pack during regeneration and charging by the ICE. The MoGen utilizes the stored energy in the battery pack to propel or drive the vehicle when the ICE is not operating. During operation, the ICE will be turned on and off intermittently, according to driving conditions, causing the battery pack to be alternatively charged and discharged by the MoGen.

State of charge (SOC) is a commonly-used term in the art. A SOC corresponds to the stored charge available to do work relative to that which is available after the battery has been fully charged; this definition is made precise in the model formulation infra. SOC can be viewed as a thermodynamic quantity, enabling one to assess the potential energy of the system. The preferred embodiment of the present invention utilizes a battery pack. However, fuel cells may be used in the instant invention as well. Alternatively, a single battery with a requisite voltage may be used. As can be appreciated, the state of charge (SOC) of the battery pack in a vehicle system such as a hybrid vehicle system is important in relation to vehicle efficiency, emissions, and availability. For example, a vehicle operator or an onboard controller needs to know the condition of the battery pack for regulating the same.

It is known in the art to use a look up table (LUT) to regulate a battery pack having parameters pre-computed based on a standard vehicle or an experimental vehicle. A standard vehicle is a vehicle other than the vehicle, which a vehicle operator is handling. A difficulty with the prior art approaches is that they are either not vehicle specific, or lack a generalized approach to multiple parameter handling, thereby reducing the utility of the prior art systems. In addition, it is known in the art to use Coulomb counting to get a SOC value of a battery system. Coulomb counting is easily implemented, provided the current efficiency is known precisely for all times and conditions. Because this is not normally the case, the voltage signal can be used in a model that incorporates the voltage for determining the SOC.

SUMMARY OF THE INVENTION

The present invention provides methods and apparatus for determining resistance and open circuit potential of a battery system using a fully recursive least squares analysis, which is based on previous time-step data. This reduces the storage space and execution time required for implementing the methods in a computer program product. The recursive least squares approach may incorporate exponential forgetting. The methods comprise means to weight various data points over others. For example, it is often desired to give more weight to discharge current-potential points because discharge performance is better understood. The methods may comprise a skew test that performs a determination as to how much the data is skewed. If data is skewed to such an extent that significant statistical analyses is not possible, a different course of action may be preferred. Furthermore, the methods may comprise a traditional variance test. Both the skew test and the traditional variance test are fully recursive.

A first method is provided for determining state of charge (SOC) of a battery system based upon an equivalent circuit reflecting the battery system. A potential and resistance of the equivalent circuit are computed. The method uses a least squares regression means, and includes: providing a plurality of data points as a starting point based upon determinations including measurement or prior computation, wherein the determinations include a determination of a voltage of the battery system; weighting the plurality of data points; and computing values of the resistance and potential based upon weighted data points using recursive formulas, wherein only a state at a previous time is reflected respectively.

A second method is provided for determining a state of charge (SOC) in a battery system based on values of a resistance R and an open circuit voltage $V_{oc}$, respectively. Both of the resistance R and the open circuit voltage $V_{oc}$ are derived using recursive expressions. The second method includes: creating a plurality of data points; establishing a linear relationship using the resistance R and the open circuit voltage $V_{oc}$; applying least square analysis upon the linear relationship; and formulating a recursive relationship, wherein a first state at a backward time increment solely determines a second state after the backward time increment.

A vehicle powertrain control system is provided, which includes: a battery pack; a power inverter coupled to the battery pack; a controller controlling the power inverter, the controller monitoring a state of charge (SOC) of the battery pack; and a program product for computing a resistance and an open circuit voltage both being functionally related to the SOC, the program product being associated to the controller.

These and other features and advantages of the invention will be more fully understood from the following description of certain specific embodiments of the invention taken together with the accompanying drawings.

DESCRIPTION OF THE PREFERRED EMBODIMENT

Figure 1:
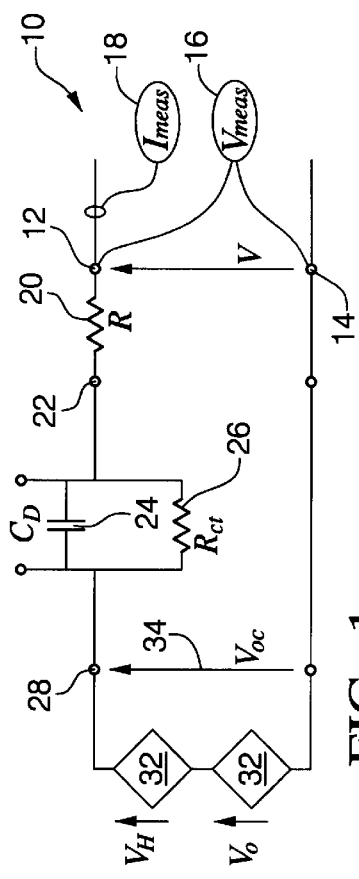
FIG. 1 is an equivalent circuit used to model a battery system.

Referring now to the drawings in detail, in FIG. 1 numeral 10 generally indicates an equivalent circuit of a battery module suitable for the instant invention. Equivalent circuit 10 has a first end 12 and a second end 14, with a voltage V existing therebetween. A voltage measuring means 16 such as a voltmeter can be disposed between the first end 12 and second end 14 for a reading of the measured voltage V. An electric current measuring device 18 is adapted to measure an electric current at first end 12. A series resistance R 20 is disposed between a third point 22 and first end 12. A capacitance $C_D$ 24, and a parallel resistance $R_{ct}$ 26, are disposed between third point 22 and a fourth point 28. A battery voltage source $V_O$ 30 and a hyteresis voltage source $V_H$ 32, coupled together in series, are disposed between a fourth point 28 and second end 14. Between fourth point 28 and second end 14, an open circuit voltage $V_{oc}$ 34 is defined.

Figure 2:
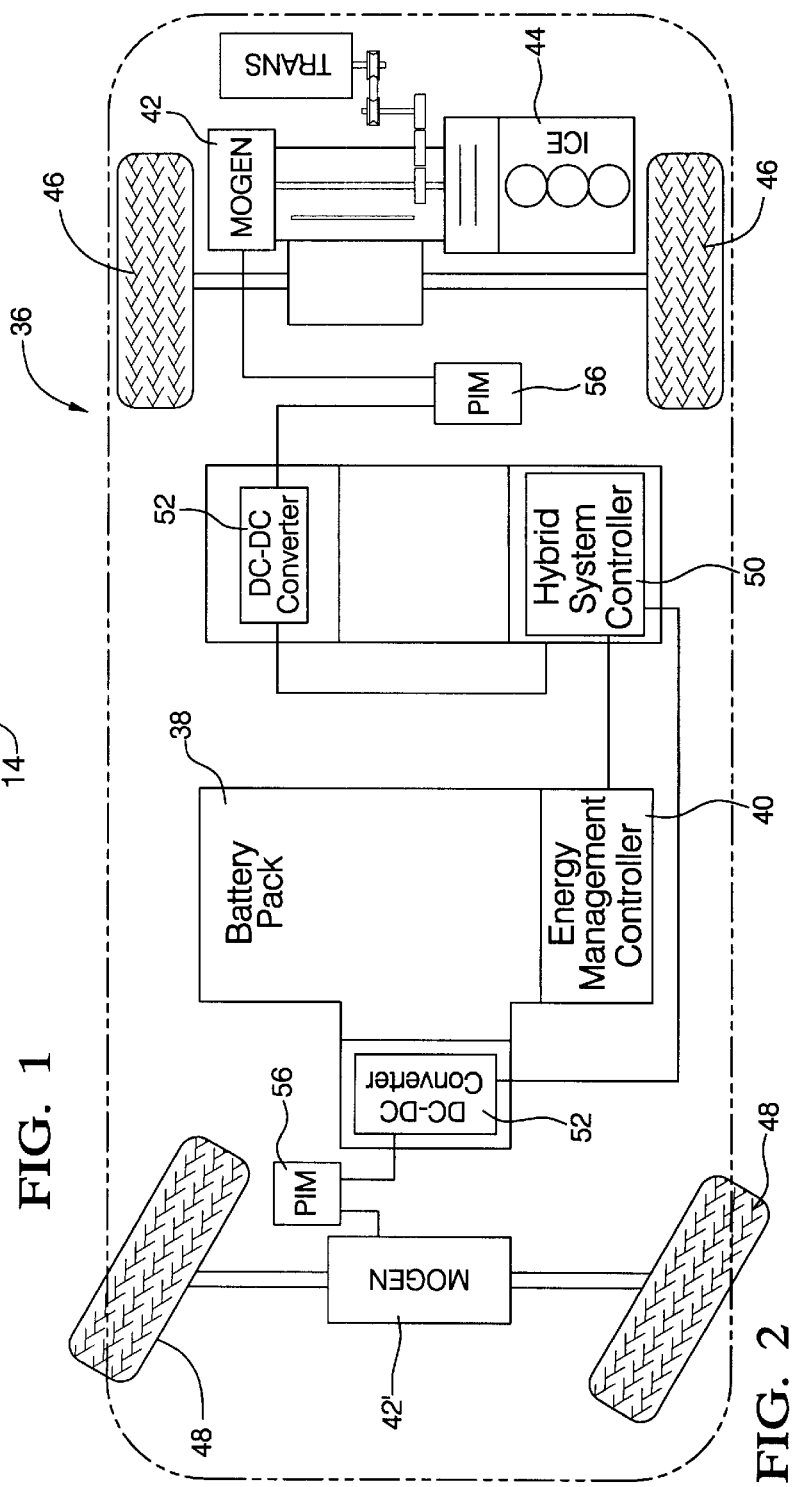
FIG. 2 is a diagrammatic drawing of a hybrid vehicle of the present invention.

FIG. 2 is a diagrammatic drawing of a hybrid vehicle 36 of the present invention. The hybrid vehicle 36 includes a battery pack 38 having a single battery module or a plurality of individual battery modules. In a first embodiment, the battery pack 38 includes a plurality of NiMH batteries connected in series to produce a 336-Volt nominal bus. In a second embodiment, the battery pack 38 includes a plurality of lead-acid batteries connected in series to produce a desired voltage. In alternate embodiments of the present invention, the battery pack 38 may include any known battery technology including, but not limited to, lithium-ion, and lithium polymer, as well as fuel cell technology. An energy management controller (EMC) 40 monitors a set of parameters including but not limited to the current, voltage, state of charge (SOC), battery internal resistances (e.g., R 20), and power output of the battery pack 38.

A motor generator (MoGen) 42 is dynamically coupled to an internal combustion engine (ICE) 44 and functions as either a motor to propel the vehicle 36 or a generator to charge the battery pack 38, depending on the operating state of the vehicle 36 (i.e., braking, accelerating, or operating at a constant speed on a highway). The MoGen 42 is preferably an AC induction machine, but may include any known electrical motor/generator technology including but not limited to DC machines, synchronous machines, and switched reluctance machines. The MoGen 42 in this embodiment is located on the rear of the vehicle to drive the rear wheels 46. A similar MoGen 42' is located on the front of the vehicle 36 to drive the front wheels 48.

The MoGens 42, 42' are controlled by an electrical control system comprising a hybrid system controller 50, DC—DC converters 52, and power inverter modules 56. The EMC 40 communicates with the hybrid system controller 50 and power inverter modules 56 to provide voltage, current, and/or power output/input limits for the battery pack 38 based on a SOC measurement. In an alternate embodiment of the present invention, the EMC 40, hybrid system controller 50, DC—DC converters 52, and power inverter modules 56 may be configured as a unitary system. The EMC 40 and hybrid system controller 50 may include any type of control module or vehicle controller known in the art, and are equipped with nonvolatile memory (NVM), random access memory (RAM), discrete and analog input/output (I/O), a central processing unit, and/or communications interfaces for networking within an automotive communications network.

In generator mode, the MoGens 42, 42' generate electrical energy that is transferred to the battery pack 38 and the DC—DC converters 52 by the controller 50 and inverter modules 54. The controller 50 and inverter modules 56 determine the direction of current flow for the MoGens 42, 42', according to a vehicle 36 operating state. The DC—DC converters 52 provide and regulate a DC bus that is pulse-width-modulated by the inverter modules 56 to supply time varying current to the MoGens 42, 42'. In a regenerative state (such as during braking) or charging condition, current will flow from the MoGens 42, 42', via the inverter modules 56, to charge the battery pack 38 and provide current to the DC—DC converters 52. In a state where the MoGens 42, 42' are needed to provide propulsion, current will flow from the battery pack 38 of the MoGens 42, 42', via the DC—DC converters 52 and inverter modules 56, to power the MoGens 42, 42'.

In the preferred embodiment of the present invention, the SOC of the battery pack 38 is dynamically tracked to determine when to charge the battery pack 38. The EMC 15 and hybrid controller 23 of the present invention will control a battery pack's SOC near 50% to 70% so that the charge acceptance and efficiency during regenerative braking can be realized. However, controlling the battery pack 38 to any SOC percentage is within the scope of the present invention.

The methods executed by the EMC 15 to determine the SOC of the battery pack 38 include a current-based SOC method and measurement (ISOC), a voltage-based SOC method and measurement (VSOC), and a rest SOC method and measurement (RSOC). A selection method then determines which SOC measurement is the most accurate, depending on the operation of the battery pack 38.

Model Formulation

To calculate the state of charge, the following is utilized:

$$SOC = w(SOC_C) + (1-w)(SOC_V) \quad\quad 1)$$

where w is a weighting factor, $SOC_C$ is the state of charge as calculated by Coulomb integration, and $SOC_V$ corresponds to a voltage-based state of charge to be described later. For $SOC_C$, $$2) \quad SOC_C(t) = SOC(t-\Delta t) - \int_{t-\Delta t}^{t} \left[100\frac{\eta_I I}{Ah_{nominal}} + S_D(T)\right]\frac{dt}{3600}.$$

Time is represented by t; and I denotes current, with discharge current taken as positive. For the module of this example, the nominal capacity $Ah_{nominal}$ corresponds to the ampere-hours of capacity the battery is capable of delivering when discharge from 100% SOC to 0% SOC at the C/3 rate (i.e., at a current that discharge the nominal capacity in 1/3 hours); the self-discharge rate is often described by $$3) \quad S_D = k_0 \exp\left(-\frac{E_{A,S}}{R_g T}\right) SOC,$$

where $k_0$ and $E_{A,S}/R_g$ are constants. The current efficiency $\eta_I$, is effectively unity for the conditions at or below 70 percent SOC. $\eta_I$ declines to zero as full charge is obtained and a secondary electrochemical reaction are initiated upon further charging. In general, current efficiencies are expected to have a mild temperature dependence and decrease with increasing SOC in a battery system. The factor 3600 has units of s/h, and the factor 100 is employed to keep a consistent percent basis.

To extract the voltage-based SOCV, equation 4 a provides the starting point:

$$4a) \quad V = V_0 - IR + A\int_{\zeta=t}^{\zeta=0} I(\zeta)\exp[-B(t-\zeta)]d\zeta.$$

The first two terms on the right side give rise to an Ohmic description of the battery, as the battery voltage V is related to the open-circuit potential VO reduced by the Ohmic drop IR, where R is the battery resistance. The last term on the right side corresponds to a superposition integral, through which past currents influence the open-circuit potential beyond the first-order effect of changing the average state of charge characterizing the electrodes. (Because of the exponential weighting function, the effect of early currents is less than those of recent currents. Note that for the application of Eq. 4a, $\zeta$ is the dummy variable of integration.)

It is necessary to have a default value for the resistance; the approach for extracting the resistance from recorded data will be discussed below. In many cases, the resistance of a battery module can be fit to the following equation:

$$5) \quad R_{module} = \left(\sum_{j=1}^{n} a_j SOC^j\right)\exp\left[-\frac{E_{A,R}}{R_g}\left(\frac{1}{T} - \frac{1}{T_{ref}}\right)\right].$$

The pack resistance is given by the number of modules multiplied by $R_{module}$, as other resistances (e.g., harnesses, etc.) have been allocated to the module resistance. The activation energy is given by $E_{A,R}$ and the gas constant is denoted by $R_g$. The reference temperature corresponds to $T_{ref}$. T denotes temperature.

The open-circuit potential Voc is a function of temperature, SOC, and a hysteresis function:

$$V_{oc,cell} = Function(T, SOC, V_H) = V_{0,cell}(T, SOC) + V_H(t,I,V) \quad 6)$$

where, specific to a lead-acid cell for our experimental purposes, $$7) \quad V_{0,cell} = \sum_{i=0} a_i(T)(SOC/100)^i.$$

| Coefficients, V (25 C) | Values |
|---|---|
| $A_0$ | 1.93 |
| $A_1$ | 0.266 |
| $A_2$ | 0.342 |
| $A_3$ | −0.868 |
| $A_4$ | 0.569 |

A look-up table can be used to determine the SOC.

For the hysteresis contribution, the following first-order differential equation is constructed to calculate a hysteresis voltage $V_H$:

$$8) \quad \frac{\partial V_H}{\partial t} = -\beta\left[\eta_I I + \varepsilon(Ah_{nominal})k_0\exp\left(-\frac{E_{A,S}}{R_g T}\right)\frac{SOC}{100}\right]\left(\frac{\gamma Q_M + \text{sign}(I)V_H}{Q_M}\right).$$

This equation constructs a varying hysteresis voltage. For the lead-acid battery systems, the hysteresis voltage is set up so that for prolonged charge currents, or short but very large charge currents, the hysteresis voltage tends to +16.5 mV per cell by selecting the appropriate parameter values. The exact opposite holds for discharge (positive) currents. Note also that if the current remains at zero for a long time, the hysteresis voltage tends to the charge-decreasing condition (−16.5 mV per cell) through self-discharge.

Implementation Details

First, the Coulomb integration model is used to determine $SOC_C$:

$$9) \quad SOC_C(t) = SOC(t-\Delta t) - \left[100\frac{[(\eta_I I_{t-1} + \eta_I I_t)/2]}{Ah_{nominal}} + (S_D)_{t-\Delta t}\right]\frac{\Delta t}{3600}.$$

Note that the integration over a time interval begins at SOC, not $SOC_C$. The difference between the present time and the last recorded time is given by $\Delta t$. Next, the measured voltage is corrected for the superposition integral. First, it is helpful to note that Eq. 4a can be recast as the following recursion relation for evaluation purposes:

$$V|_t = (V_{oc} - IR)_t - (I|_t A)\Delta t + \exp(-B\Delta t)[V - (V_{oc} - IR)]_{t-\Delta t} \quad 4b)$$

where the subscripts t and t−Δt denote the time at which the quantities are to be evaluated. This equation is a particularly simple recursion relation in that only variables calculated at the previous time step are required to calculate the voltage at time t. To implement Eq. 4b, one replaces the battery voltages with measured values:

$$V^{to\ be\ used\ in\ regression} = V^{measured}|_t + (I|_t A)\Delta t - exp(-B\Delta t)[V^{measured} - (V_{oc} - IR)]_{t-\Delta t} = (V_{oc} - IR)_t \quad (4c)$$

Thus, the regression analysis to determine the open-circuit potential or resistance are based on the voltage quantity appearing on the left side, the regression voltage, and a least-squares analysis of the corrected voltage data (corresponding to the regression voltage) yields a good approximation for the Ohmic resistance and open-circuit potential.

Next, the open-circuit voltage $V_{oc}$ and the resistance R are extracted from the corrected battery voltage regression voltage (referred to simply as V in the least-squares formulas to follow) and current I. This extraction procedure is based on a recursive least-squares approach. Basic least squares can be expressed as follows:

$$\xi = \sum_{j=1}^{j=N} [y_j - (mx_j + b)]^2,$$

where $\xi$ is the error and the model (y=mx+b) of the physical system is linear. Thus, for our purposes, the slope m corresponds to the high-frequency resistance R and the intercept b corresponds to the open-circuit voltage $V_{oc}$ (from which we extract the SOC after the hysteresis contribution has been removed); $x_j$ corresponds to the measured currents; and $y_j$ corresponds to the regression voltage:

$$V^{to\ be\ used\ in\ regression} = V^{measured}|_t + (I|_t A)\Delta t - exp(-B\Delta t)[V^{measured} - (V_{oc} - IR)]_{t-\Delta t} = (V_{oc} - IR)$$

Note that this is a recursive relation, where t denotes time and the time step Δt need not be fixed. Two equations for the two unknowns m and b can be obtained by taking the first derivatives in $\xi$ with respect to the two unknowns and setting the first derivatives to zero:

$$\frac{\partial \xi}{\partial b} = \sum_{j=1}^{j=N} (-2)(y_j - mx_j - b) = 0$$

leads to $b = \frac{1}{N}\sum_{j=1}^{j=N} y_j - \frac{1}{N} m \sum_{j=1}^{j=N} x_j$, and $$\frac{\partial \xi}{\partial m} = \sum_{j=1}^{j=N} (-2x_j)(y_j - mx_j - b) = 0$$

leads to $0 = \sum_{j=1}^{j=N} x_j y_j - m \sum_{j=1}^{j=N} x_j^2 - b \sum_{j=1}^{j=N} x_j$.

These equations can be used to derive the following expressions for m and b:

$$m = \frac{\sum_{j=1}^{j=N} x_j y_j - \frac{1}{N} \sum_{j=1}^{j=N} x_j \sum_{j=1}^{j=N} y_j}{\sum_{j=1}^{j=N} x_j^2 - \frac{1}{N}\left(\sum_{j=1}^{j=N} x_j\right)^2} \text{ and } b = \frac{1}{N}\left(\sum_{j=1}^{j=N} y_j - m \sum_{j=1}^{j=N} x_j\right).$$

To make this system fully recursive, it is recognized that each sum can be constructed from its previous value and its current value; e.g., $$\sum_{j=1}^{N} x_j = x_j + \sum_{j=1}^{N-1} x_j.$$

Thus, for each sum, a form of this recursive relation is used; no storage beyond values calculated at the previous time step are required for any part of the method that may be implemented into a computer program product described in this document. This is significant in that reduced memory space and execution time are necessary for achieving the instant invention. This is especially so in a controller having limited computing capabilities. Even if the controller has the computing capability, in a real time vehicle control system, too much time wasted on computing is not practicable or desirable. For example, the conditions of a battery pack may change before a computing result is known.

For exponential forgetting and weighting, charge and discharge are treated differently. It is assumed that the parameters m and b change slowly with time and introduce a weighting factor $w_j$:

$$\xi = \sum_{j=1}^{N} w_j [y_j - (mx_j + b)]^2$$

where preferential weighting of discharge over charge is accomplished by $$w_j = \gamma_j \lambda^{N-j} \begin{cases} \gamma_j = 1, & \text{charge} \\ \gamma_j > 1, & \text{discharge.} \end{cases}$$

The exponential forgetting factor corresponds to $\lambda^{N-j}$, and $\gamma_j$ is the charge-discharge weight factor. It can be shown that the use of $\lambda^{N-j}$ yields an exponential decay in the influence of past points on the determination of the current value of m and b:

$$\lambda^{N-j} = e^{\ln \lambda^{N-j}} = e^{(N-j)\ln \lambda} \approx e^{(N-j)(\lambda - 1)}$$

for $\lambda \rightarrow 1$.

A set of intermediate functions is defined.

$$s_I = \frac{1}{\sum_{j=1}^{N} w_j} \sum_{j=1}^{N} w_j I_j$$

$$s_{II} = \frac{1}{\sum_{j=1}^{N} w_j} \sum_{j=1}^{N} w_j I_j^2$$

$$s_V = \frac{1}{\sum_{j=1}^{N} w_j} \sum_{j=1}^{N} w_j V_j$$

$$s_{IV} = \frac{1}{\sum_{j=1}^{N} w_j} \sum_{j=1}^{N} w_j I_j V_j$$

where N represents the number of recorded current-potential data points to be included in the extraction of the open-circuit voltage $V_{oc}$ and the resistance R; note $$\sum_{j=1}^{N} w_j \bigg|_{w_j=1 \text{ for all } j} = N$$

and the $w_j$ in the rightmost summation of each equation above is removed if $w_j=1$ for all j. Using these expressions, the following can be written:

$$R = -\frac{s_{IV} - s_I s_V}{s_{II} - (s_I)^2}$$

and $$V_{oc} = \frac{s_{II} s_V - s_{IV} s_I}{s_{II} - (s_I)^2}.$$

The remaining manipulations recast these equations into the fully recursive form as indicated above. Specifically, the following equations are implemented; the first equation is to be implemented prior to the following four at each time step:

$$s_w |_N = \sum_{j=1}^{N} w_j = \sum_{j=1}^{N} \gamma_j \lambda^{N-j} = \gamma_N + \lambda \sum_{j=1}^{N-1} \gamma_j \lambda^{N-1-j} = \gamma_N + \lambda(s_w |_{N-1})$$

$$s_I |_N = \frac{1}{\sum_{j=1}^{N} w_j} \sum_{j=1}^{N} w_j I_j = \frac{\gamma_N I_N + \lambda(s_I |_{N-1})(s_w |_{N-1})}{(s_w |_N)}$$

$$s_{II} |_N = \frac{1}{\sum_{j=1}^{N} w_j} \sum_{j=1}^{N} w_j I_j^2 = \frac{\gamma_N I_N^2 + \lambda(s_{II} |_{N-1})(s_w |_{N-1})}{(s_w |_N)}$$

$$s_V |_N = \frac{1}{\sum_{j=1}^{N} w_j} \sum_{j=1}^{N} w_j V_j = \frac{\gamma_N V_N + \lambda(s_V |_{N-1})(s_w |_{N-1})}{(s_w |_N)}$$

$$s_{IV} |_N = \frac{1}{\sum_{j=1}^{N} w_j} \sum_{j=1}^{N} w_j I_j V_j = \frac{\gamma_N I_N V_N + \lambda(s_{IV} |_{N-1})(s_w |_{N-1})}{(s_w |_N)}$$

Thus, the far right term in each of the above five equations allows one to determine the indicated sum by considering values at the time step N and calculated values from the previous time step. Another useful feature of the above equations is that although exponential forgetting is embedded within the system, no exponentiation that could lead to underflow or overflow errors results in the equation system. Care must be exercised in starting up recursive routines; the following expression are used for N=1

$$s_w|_1 = \gamma_1$$

$$s_I|_1 = \gamma_1 I_1$$

$$s_{II}|_1 = \gamma_1 I_1^2$$

$$s_V|_1 = \gamma_1 V_1$$

$$s_{IV}|_1 = \gamma_1 I_1 V_1$$

A variance test is important for the first time step in particular. Let $$\text{denom\_test} = \begin{cases} 1 & \text{if } s_{II} - (s_I)^2 \geq \underline{0.5 \text{ A}} \\ 0 & \text{if } s_{II} - (s_I)^2 < \underline{0.5 \text{ A}} \end{cases}$$

Underlined values represent suggested calibrations, which may be changed to fit into a particular system. If denom_test is 0, then $$R(t) = R(t - \Delta t)$$

and $$V_{oc} = V(t) + I(t) R(t)$$

where V(t) corresponds to the corrected regression. Note also that the default resistance provides R (t=0). Thus for the first data set, $$V_{oc} = V(0) + I(0) R(t=b\ 0) = V_1 + I_1 R(t=0)$$

A recursive skew test is defined next. For our purposes, skewness is defined as $$10)\ \text{Skewness} = \left| \frac{1}{N \sigma^3} \sum_{j=1}^{j=N} (x_j - \bar{x})^3 \right|$$

where $\bar{x}$ is the average of the x-values ($\bar{x} = s_I$) and $\sigma^2$ is a variance ($\sigma^2 = S_{II} - S_I^2$). The skewness test is restricted to the actual current-time values and does not incorporate the charge-discharge weighting. Following the same logic used previously, the following summations and recursive relations are employed, with the subscript s is added to indicate quantities associated with the skewness calculation:

$$s_{w,s} |_N = \sum_{j=1}^{N} \lambda^{N-j} = 1 + \lambda \sum_{j=1}^{N-1} j \lambda^{N-1-j} = 1 + \lambda(s_{w,s} |_{N-1})$$

$$s_{I,s} |_N = \frac{1}{\sum_{j=1}^{N} \lambda^{N-j}} \sum_{j=1}^{N} \lambda^{N-j} I_j = \frac{I_N + \lambda(s_{I,s} |_{N-1})(s_{w,s} |_{N-1})}{(s_{w,s} |_N)}$$

$$s_{II,s} |_N = \frac{1}{\sum_{j=1}^{N} \lambda^{N-j}} \sum_{j=1}^{N} \lambda^{N-j} I_j^2 = \frac{I_N^2 + \lambda(s_{I,sI} |_{N-1})(s_{w,s} |_{N-1})}{(s_{w,s} |_N)}$$

$$\text{skewness}|_N =$$

$$\begin{cases} \text{skew\_cal} & \text{if denom\_test} \leq 0 \\ \left[ \dfrac{\left| \dfrac{(I_N - s_{I,s} |_N)^3}{[s_{II,s} |_N - (s_{I,s} |_N)^2]^{3/2}} \right| + (\text{skewness}|_{N-1})(N-1)}{N} \right] & \text{if denom\_test} > 0 \end{cases}$$

The value of skew_cal represents a calibration. A larger value may be more appropriate if it is desired to start the RLS portion of the method that may be implemented into a computer program product sooner (e.g., skew_cal=10 seems to work well). To start the recursive calculations for skewness, the following conditions are used.

$S_{w,s}|_1=1$ $S_{1,s}|_I=I_1$ $S_{II,s}|_I=I_1^2$

Analogous to denom_test, define $$\text{skew\_test} = \begin{cases} 0 & \text{if skewness} \geq \text{skew\_cal} \\ 1 & \text{if skewness} < \text{skew\_cal} \end{cases}$$

As with denom_test, the regression analysis is not employed if the skew test is not passed: If skew_test is 0, then $R(t)=R(t-\Delta t)$ and $V_{oc}=V(t)+I(t)R(t)$ Because the value of skewness is set to skew_cal whenever denom_test=0, the RLS portion of the method that may be implemented into a computer program product will be implemented on the subsequent time steps if and only if the value of skewness is reduced through variations in the current source.

The discussion immediately above shows one how to extract the open-circuit voltage. It now remains to convert this quantity into $SOC_v$, and for this the hysteresis-voltage must be treated.

For the time integration, the following is applied:

11)
$$V_H(t) = w_H\left\{V_H - (\Delta t)\beta\left[\eta_I I + \varepsilon(Ah_{nominal})k_0\exp\left(-\frac{E_{A,S}}{R_g T}\right)\frac{SOC}{100}\right]_{t-\Delta t}\left(\frac{\gamma Q_M + \text{sign}(I)V_H}{Q_m}\right)\right\}_{t-\Delta t} + $$
$$(1-w_H)[V_{oc,cell} - V_0(T, SOC_V)]_{t-\Delta t}$$

Although the subscript on the large brackets and braces indicates that values to the right of this equation can be evaluated at the previous time step, it should be noted that the current is known (measured) for all times, so the current employed (and the current efficiency) can be taken as the average of the present and previous time step. In addition, it is important to note that this equation is not a straightforward time integration of Eq. 8 unless the weighting factor $W_H$ is set to unity. Thus, the second line of the above equation allows for a correction to the extraction of the hysteresis voltage through the recognition that the previous time step value for the SOC can be used to calculate an open-circuit voltage—this back-calculated open-circuit voltage provides a value of $V_H$ that will quite likely differ from that calculated through Eq. 8. Thus, the approach taken in the above equation is to construct a weighted sum.

The next step is to transform the open-circuit voltage $V_{oc}$ into a voltage-based state of charge, including the hysteresis voltage. Because we can now calculate $V_0(T, SOC_V)=V_{oc}-V_H$, we can simply invert $V_0(T, SOC_V)$—e.g., by a look-up table as described above—to extract $SOC_V$. Finally, as noted initially, the combined SOC can now be calculated:

$SOC=w(SOC_C)+(1-w)(SOC_V)$

An important topic to be clarified is the weight factors w and wH; the influence of the time step size needs to be addressed in the calculation of these factors as well. That is, if very small time steps are employed, then the weighting factor should be altered so that time-dependent quantities are not lost from the calculation and instead are allowed to evolve in accordance with their particular time constants. Thus, the following approach is applied in this example application:

$w=w_{max}-\alpha_w(\Delta t)$ and $w_H=w_{H,max}-\alpha_H(\Delta t)$     12)

In addition, as described above for the resistance, these weighting factors are bounded (e.g., between 0 and 1).

When the battery SOC exceeds about 95%, the voltage-based state of charge can become inaccurate, owing to the less predictable processes associated with over-charge reactions. Similarly, for short times (i.e., before the regression analysis allows for accurate fitting of the resistance and open-circuit potential), w is set to unity, and the SOC is calculated for this short time based solely on Coulomb integration. In yet another special case, when the battery has been at rest for prolonged periods, the hysteresis model returns a value of $V_H$ that is less than −10 mV in this example, and the magnitude of the current is quite low (e.g., less than 0.1 A). In this case, the voltage-based state of charge is likely to provide the most accurate estimate for the combined SOC. Thus, for this example, (specific values suggested for a lead-acid battery)

If abs[I]<0.1 and $V_H$<−10 mV then w=0.5

The quantity $\alpha_w$ is obtained as follows. In order to make the method that may be implemented into a computer program product adaptive with a shorter duration to a pseudo-steady state, a provision is made to reduce the weight factor w upon start-up of the method that may be implemented into a computer program product. In addition, the voltage-based contribution is further enforced when the SOC falls below a calibrated value (20% is suggested immediately below). With these thoughts in mind, the following procedure is used to calculate w.

If $t < 30s$ or $SOC > 95\%$ or

[denom_test = 0 and abs($I$) > 0.1 A and $SOC > 20$] or

[denom_test = 0 and $V_H > -0.010$ V and $SOC > 20$] then $w = 1$ else $w = \min\{1, \max[0.5, 1 - \alpha_w(\Delta t)]\}$ where $$\alpha_w = \begin{cases} \text{for } t < t_{init} : \alpha_{w,init} + (\alpha_{w,f} - \alpha_{w,init})\dfrac{t}{t_{init}} \\ \text{for } t \geq t_{init} : \alpha_{w,f} \end{cases}$$

-continued $$\alpha_{w,f} = \begin{cases} \text{for } SOC \geq \underline{50}\%: \alpha_{w,f}|_{\underline{50}\% \, SOC} \\ \text{for } SOC < \underline{50}\%: \min\left[10, \dfrac{2500}{SOC(100-SOC)}\right] \times \alpha_{w,f}\bigg|_{\underline{50}\% \, SOC} \end{cases}$$

Suggested parameter values are

| | | |
|---|---|---|
| $\alpha_{w,init}$ | 0.01 | $s^{-1}$ |
| $\alpha_{w,f}$ | 0.001 | $s^{-1}$ |
| $t_{init}$ | 500 | $s$ |

Note that the last line implies that w is bounded between (calibrations) 0.5 and 1.

Figure 3:
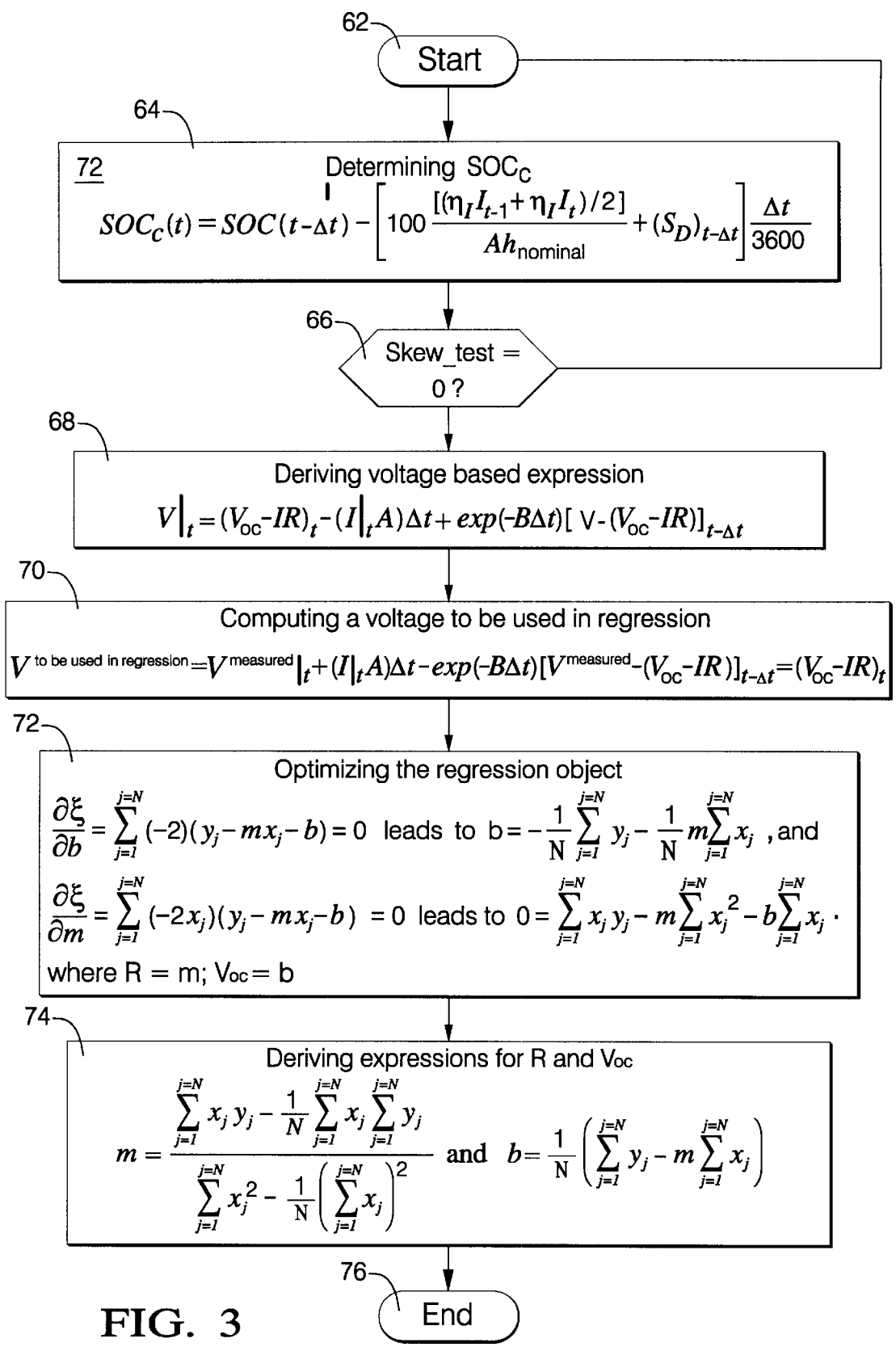
FIG. 3 is a flowchart of the present invention.
Figure 4:
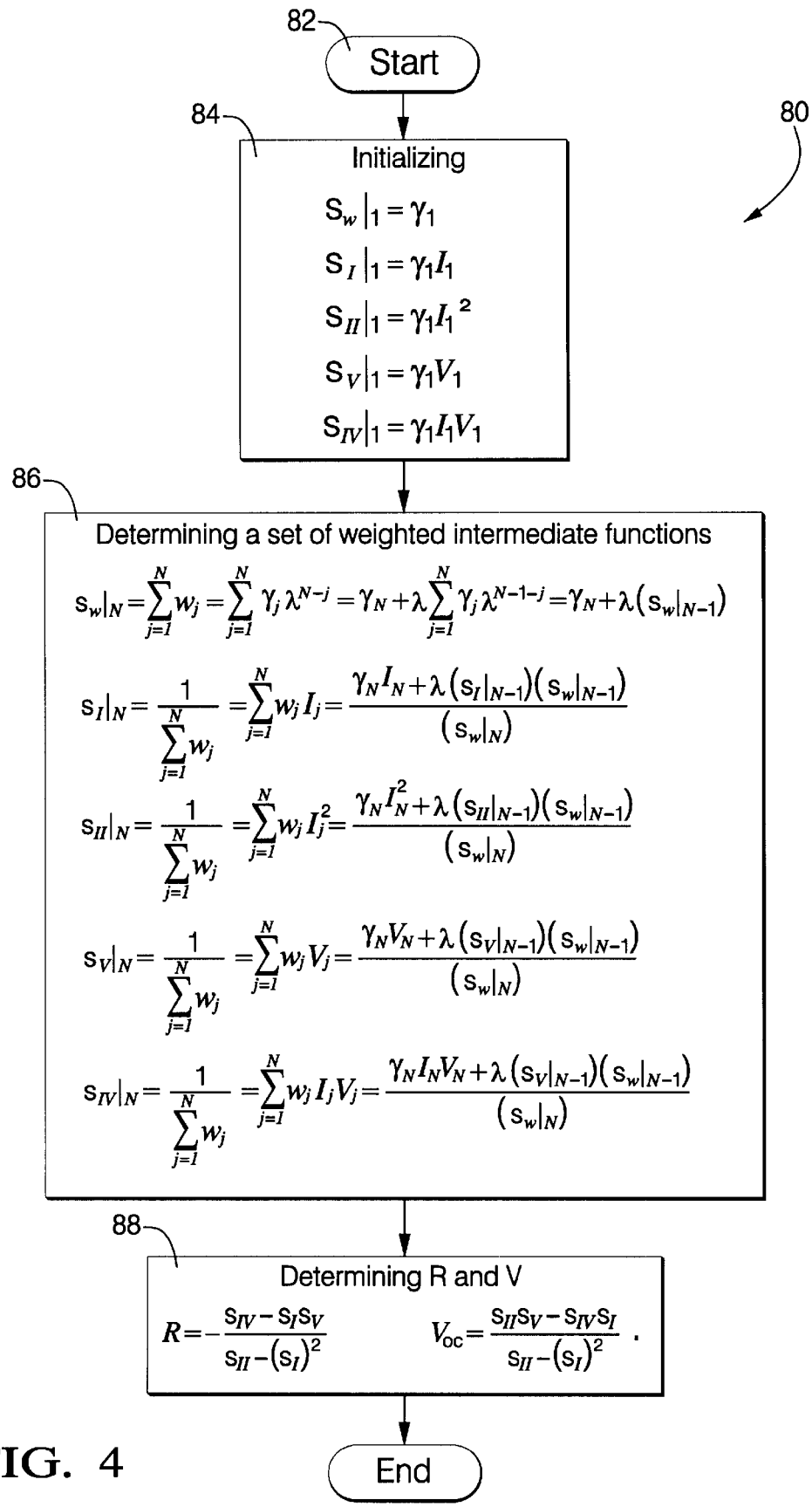
FIG. 4 is flowchart showing a process in getting a recursive expression of a resistance and open circuit voltage based on the present invention.
Figure 5:
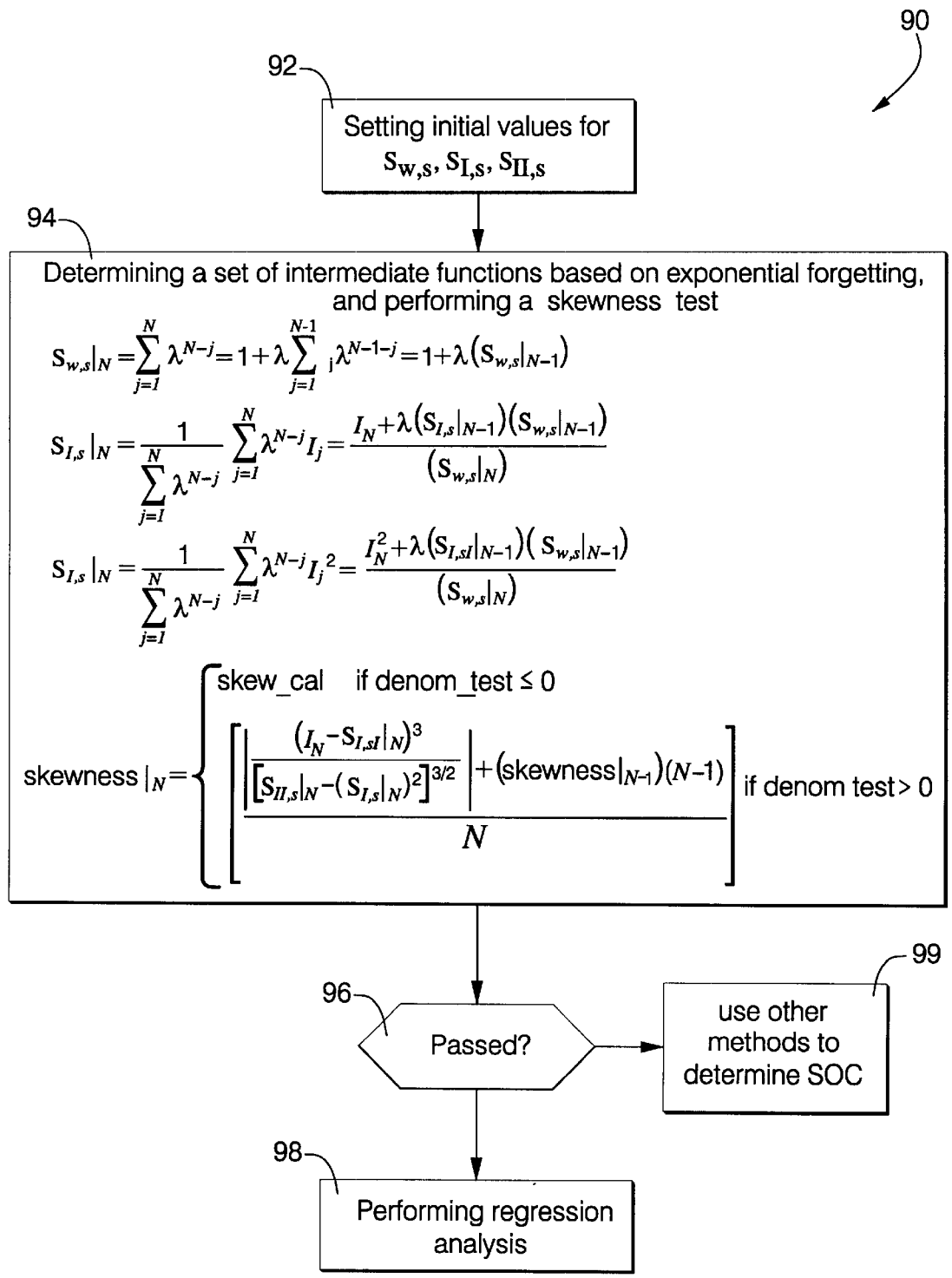
FIG. 5 is flowchart showing a process in getting a recursive expression of a skew test of the present invention.

Referring to FIGS. 3–5, FIG. 3 is a flowchart 60 showing a method of the present invention. At step 62, flowchart 60 starts. At step 64 a current based state of charge, $SOC_C$ at time t is shown. This $SOC_C$ is derived, in part, from previous state at time t−Δt. A skew test is performed at step 66, wherein a value determination is processed. If the skew test results in a zero value, the remaining steps of flowchart 60 are not performed. If skew_test is not zero, then the process flows toward step 68, wherein a voltage that is a function of a voltage based $SOC_V$ is expressed to include elements of a state at time t−Δt, among others. At step 70, measured voltage values are inserted for a determination of a voltage value for regression. At step 72, expressions of R and $V_{oc}$, which are elements of an equivalent circuit of a battery system are derived via a least square means. It is noted that individual data points $x_j$, $y_j$ are weighted within the summations shown in block 72. As described supra, the weighting function includes an exponential forgetting factor $\lambda^{N-1}$ and a charge/discharge factor $\gamma_j$ in order to better reflect the true nature of SOC. At step 74, expressions of R and $V_{oc}$ are expressed in a regressed form, wherein all of the data points are weighted as well. In other words, the weighting of individual data points is implemented within the sums shown in step 72 and step 74. Referring now to FIG. 4, a derivation of R and $V_{oc}$ using recursive formula based on a set of intermediate functions $s_i$ (where i=w, I, II, V, IV) are described in flowchart 80. At step 82, the derivation starts. At step 84, a set of initial value is assigned to the set of intermediate values. At step 86, a set of recursive expressions relating to the set of intermediate values is shown. At step 88, values of R and $V_{oc}$ are computed based on the set of intermediate functions. It is noted that flowchart 80 incorporates the weighting function, which includes the exponential forgetting factor $\lambda^{N-j}$ and the charge/discharge factor $Y_j$.

Turning now to FIG. 5, flowchart 90 depicts a process for performing a recursive skew test based on exponential forgetting. At step 92, a second set of intermediate functions $S_{w,s}$, $S_I$, $S_{II,s}$ are assigned an initial value. At step 94, recursive expressions of the set of intermediate functions $S_{w,s}$, $S_I$, $S_{II,s}$ are shown. The values of $S_{w,s}$, $S_I$, $S_{II,s}$ are based on a state at previous time step. Step 94 further includes a skewness test suitable for computer program product implementation. If a result passed the skewness test at step 96, the process continues with regression analysis described in this invention at step 98. For example, proceed onto flowchart 80 of FIG. 4 in the next time step. If skewness is too great for a predetermined environment, regression analysis is not performed. At this juncture (block 99), Coulomb counting may be used until skew_test and denom_test both are passed. In one embodiment, in order to keep Coulomb counting accurate, a system can keep the reduction of the current drain on the battery to a minimum if an undervoltage or overvoltage is the result. The reason is that the system is not able to track the SOC accurately if the current drain exceeds a threshold point. However, this is a rare occurrence since there is always enough noise in the current, or sufficient current values to get a sufficiently good reading eventually.

In order to make the method suitable for a computer program product adaptive with a shorter duration to reach a pseudo-steady state, a provision is made to reduce the weight factor w upon start up of the method that may be implemented into a computer program product. A second change is that voltage-based control is further enforced when the SOC falls below a calibrated value (20% is suggested immediately below).

Skewness analysis could be very important for a lead-acid hybrid battery in that long durations under charge conditions are expected, followed by abrupt discharge pulses, a condition that could lead to a poor set of data for linear regression even through the variance of the data is sufficient. For skewness greater than a predetermined value, for example 2.5, the linear regression is not used.

Figure 6:
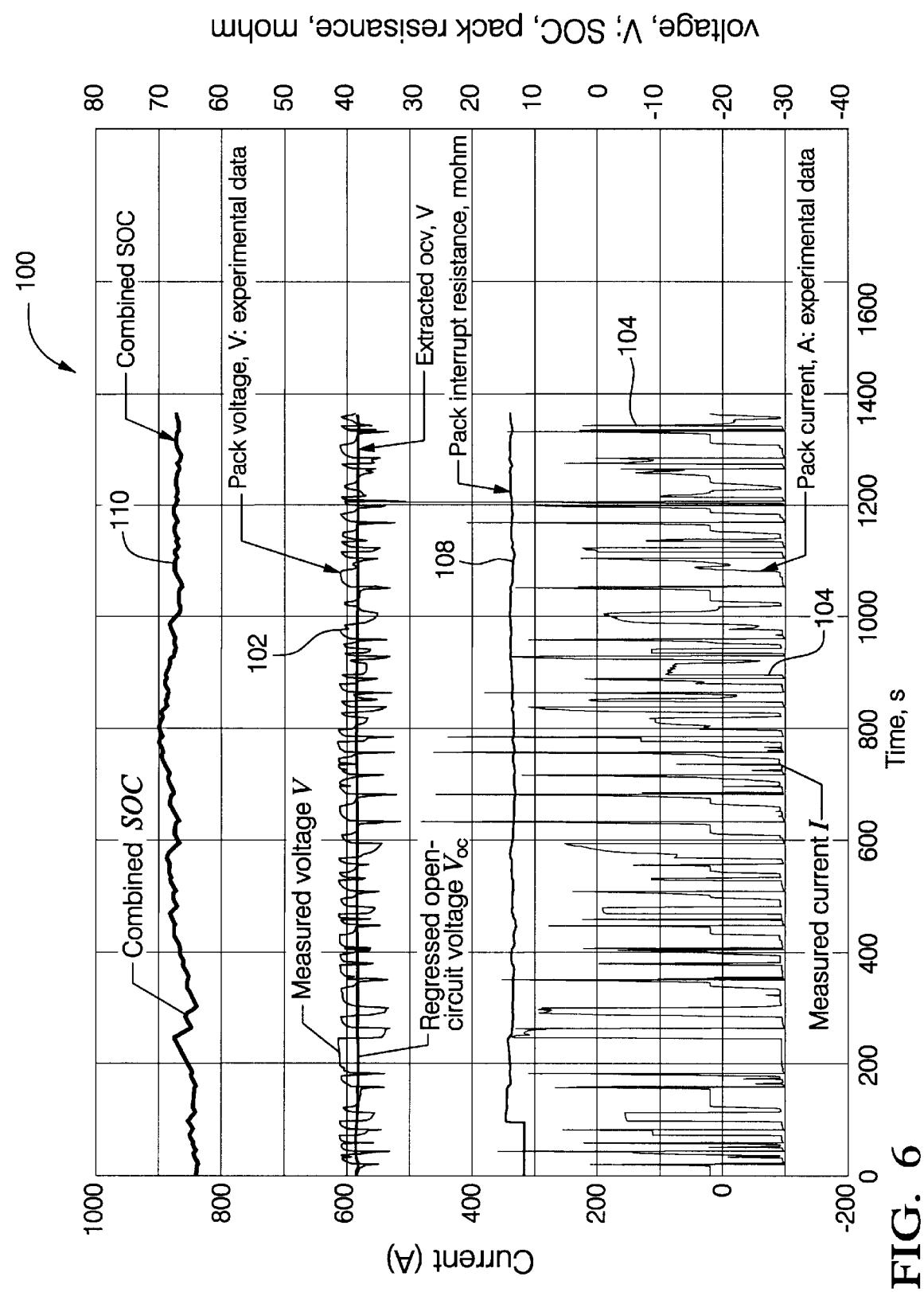
FIG. 6 shows a plot along a timeline of various parameters of the instant invention.

Referring to FIG. 6, a graphic depiction 100 using least square method with exponential forgetting along a time line is shown. Line 102 depicts a measured voltage but along the time line. It is noted that the measurement can be discrete, or the measurement can be continues. Line 104 depicts a measured current corresponding to line 102. Line 106 depicts the regressed open circuit voltage $V_{oc}$ based on the measured data points of lines 102, 104 according to this invention. Similarly, line 108 depicts the regressed value of resistance R, and line 110 depicts values of combines SOC based on values including values of open circuit voltage $V_{oc}$ and resistance R.

Figure 7:
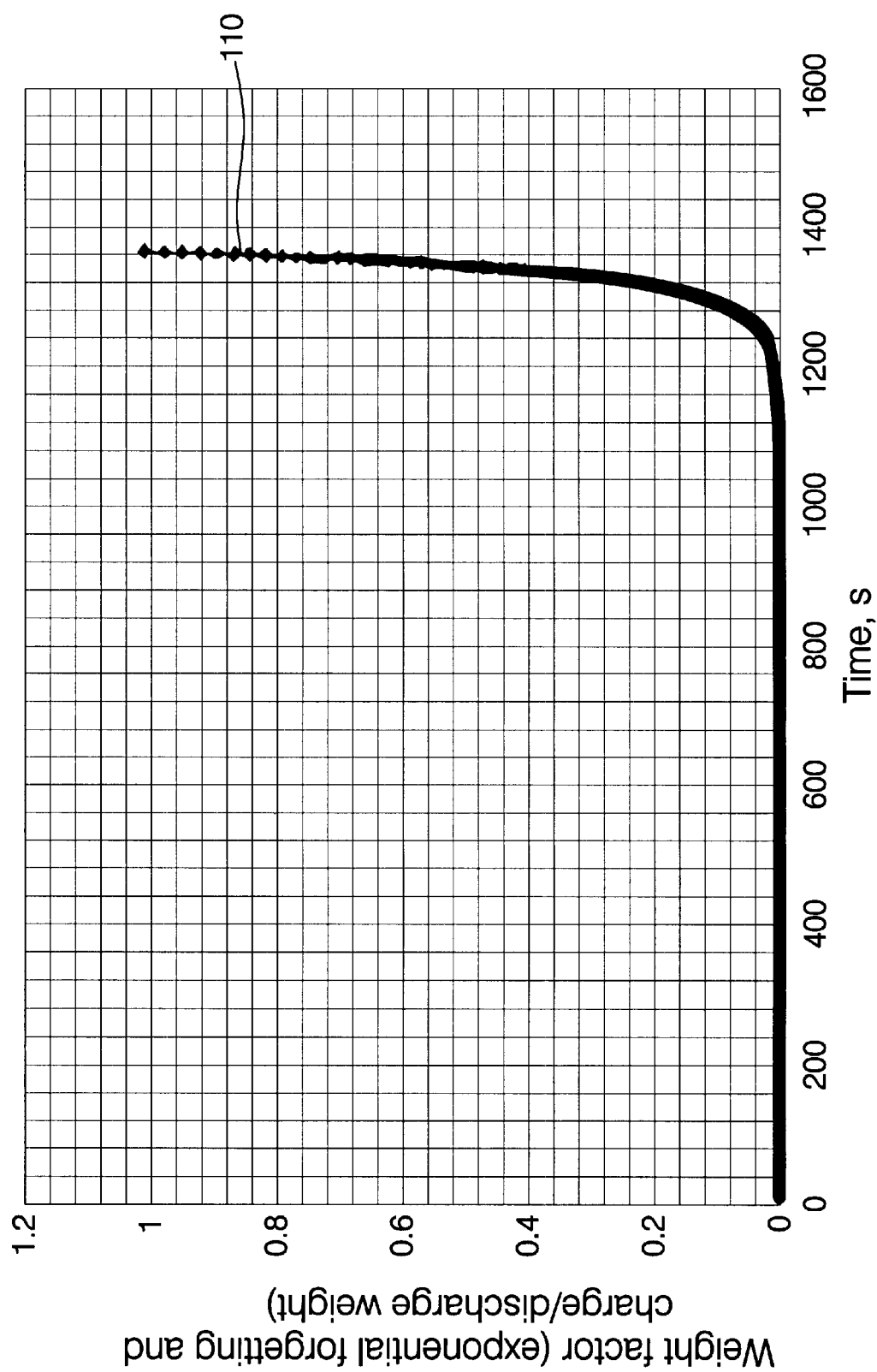
FIG. 7 shows the effects of a weight factor that incorporates exponential forgetting.

FIG. 7 shows the effect which the weight factor w(t) possesses. Line 110 shows a congregation of points computed based on γ=1, λ=0.97, N=1374. As can be seen, the value at previous time increment approaches extremely close to 1, whereas the values prior to the previous time increment approaches 0 rather quickly. In other words, when discharge to charge factor is set to one, this plot shows how the exponential forgetting weights previous points relative to the last point.

Another unique feature to the current method that may be implemented into a computer program product is that discharge can be emphasized over charge through a weighting factor. The weighting factor can be important in the implementation of this method that may be implemented into a computer program product. It is important because (1) the low-frequency components (of the equivalent circuit elements $R_sC_D$) are fit to data and not regressed during battery operation, and (2) the low frequency components influence significantly the voltage behavior on charge (but not nearly so much on discharge). Thus, if we want to minimize the influence of non-regressed parameters on battery behavior, we can weight preferentially the discharge events over charge events.

The following is a description of the recasting of the method that may be implemented into a computer program product in a fully recursive form. The instant method requires less storage, and in a sense eliminates storage issues associated with the data bucket because of the recursive nature of the equations, and that only the most recent data point is required. The instant method also tends to smooth out the plots of the extracted parameters. The instant method accomplishes the above, in part, through the following two steps: first, a set of recursive formulations is provided, then exponential forgetting and charge-discharge weighting are provided. Without the forgetting factor, the method that may be implemented into a computer program product having a similar result as a data bucket that grows with time and without bound. Furthermore, the data bucket approach takes more time to compute, as well as takes increased storage space. The data bucket approach has a disadvantage in that each point is given the same weight regardless of when it was recorded. Furthermore, data bucket approach has other disadvantages compared with the instant method. For example, in data bucket approach, more memory space and computing capabilities are required since more data points are included and more complicated computation needs to be performed. In the instant method, only parameters reflecting the state at the previous time step is needed. This way, a significant reduction in a controller's operational complexity is realized. Therefore, the controller may be freed for other endeavors.

Calculation of Max Discharge and Charge Power Available From the Battery

The max discharge power can be expressed as:

$$P_{max, discharge} = IV = IV_{min}.$$

That is, when the battery voltage obtains its lowest acceptable value, the max discharge power results. $V_{min}$ is a predetermined value-based vehicle specification, and I is current.

First consider an Ohmic battery, wherein the superposition integral (low frequency impedance) can be ignored. For the Ohmic battery, $V = V_0 - IR$, and $$P_{max,discharge} = IV_{min} = \frac{(V_0 - V_{min})}{R} V_{min}.$$

Similarly, the max charge power for the Ohmic battery is given by $$P_{max,charge} = IV_{max} = \frac{(V_0 - V_{max})}{R} V_{max}.$$

The Ohmic battery does not address transient effects such as those correlated by the superposition integral. To improve the estimate, for times that are greater than ~0.1/B, recall Eq. 4b:

$$V|_t = (V_0 - IR)_t - (I|_t A)\Delta t + \exp(-B\Delta t)[V - (V_0 - IR)]_{t-\Delta t}. \text{ Thus}$$

$$I|_t = \frac{(V_0 - V)_t + \exp(-B\Delta t)[V - (V_0 - IR)]_{t-\Delta t}}{R + A\Delta t},$$

$$P_{max,discharge} = IV_{min} = \left[\frac{(V_0 - V_{min})_t + \exp(-B\Delta t)[V - (V_0 - IR)]_{t-\Delta t}}{R + A\Delta t}\right]V_{min},$$

and $$P_{max,charge} = IV_{max} = \left[\frac{(V_0 - V_{max})_t + \exp(-B\Delta t)[V - (V_0 - IR)]_{t-\Delta t}}{R + A\Delta t}\right]V_{max}$$

To implement these equations, the respective powers are calculated immediately after the method that may be implemented into a computer program product has been employed to finish the SOC determination at time t. In this case, quantities calculated or measured at time t are then stored in the variables listed in the respective power expressions at time $t-\Delta t$. Then one must state the duration corresponding to the desired estimate for power. (It would seem sufficiently accurate to not update $V_0$ unless $\Delta t$ exceeds tens of seconds. One could then use Coulomb counting on the projected current to estimate a new state of charge and update $V_0$.) For example, if we want to know the power estimates 3 seconds from "now", then the current measured and extracted values are placed in the $t-\Delta t$ quantities, t and $\Delta t$ are set to 3 s, and the right sides of the above equations yield the desired power estimates.

Note that for the lead-acid battery of this study, the time constants for charge and discharge are about 5 s; thus it is likely that the Ohmic-battery estimates will suffice for times less than 1 second. This is because the time constant for the capacitor containing in the equivalent circuit such as shown in FIG. 1 has a time response factor $C_D R_{ct}$. This quantity is about 5 seconds. For times much shorter that this (e.g., 1s), the effect of capacitor $C_D$ is effectively shorted out, and only the ohmic resistance R affects the response.

One embodiment of the invention is implemented as a program product for use with a computer system such as, for example, energy management controller 40, or hybrid system controller 50 with features described below. The program(s) of the program product defines functions of the embodiments including the methods described below with reference to FIGS. 3–5 and can be contained on a variety of signal-bearing media. Illustrative signal-bearing media include, but are not limited to, (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct the functions of the present invention, represent embodiments of the present invention. In general, the routines executed to implement the embodiments of the invention, whether implemented as part of an operating system or a specific application, component, program, module, object, or sequence of instructions may be referred to herein as a "program". The computer program typically is comprised of a multitude of instructions that will be translated by the native computer into a machine-readable format and hence executable instructions. Further, programs are comprised of variables and data structures that either reside locally to the program, or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

While the invention has been described by reference to certain preferred embodiments, it should be understood that numerous changes could be made within the spirit and scope of the inventive concepts described. Accordingly, it is intended that the invention not be limited to the disclosed embodiments, but that it have the full scope permitted by the language of the following claims.

What is claimed is:

1. A method for determining a state of charge (SOC) of a battery system based upon an equivalent circuit of said battery system using least square regression comprising:

determining an open circuit potential and resistance of said equivalent circuit;

providing a plurality of data points based upon determinations including measurement or prior computation;

weighting said plurality of data points; and computing values of said resistance and open-circuit potential based upon weighted data points using least square analysis expressed in recursive formulas to determine the SOC.

2. The method of claim 1 including determining a current-based state of charge measurement based on Coulomb integration if battery current is stable and a voltage based determination is inaccurate.

3. The method of claim 1 including using a skew test to determine whether said plurality of data points are skewed, said skew test incorporating an exponential forgetting factor or a charge-discharge weight factor.

4. The method of claim 3, wherein said skew test is performed using a fully recursive expression including a summation representing a state at the previous time step and a current data point.

5. The method of claim 1, wherein said weighting step includes using an exponential forgetting factor.

6. The method of claim 1 including computing a recursive power expression based on said data points, and a current data point.

7. A method for determining a state of charge (SOC) in a battery system based on determining values of a resistance R and an open circuit voltage $V_{oc}$, respectively, comprising:

creating at least two data points based upon measurement or prior computation;

establishing a linear relationship using said resistance R and said open circuit voltage $V_{oc}$;

applying least square analysis upon said linear relationship;

formulating a recursive relationship, wherein a first state at a backward time increment solely determines a current state after said backward time increment, said recursive relationship being the summation of said first state manifested in a recast summation derived from integrals, and a data point at current time.

8. The method of claim 7, including:

determining a first set of intermediate functions;

assigning initial values to said first set of intermediate functions;

establishing a recursive relationship of said set of intermediate functions; and computing values of said resistance R and said open circuit voltage $V_{oc}$ based upon said first set of intermediate functions.

9. The method of claim 7, wherein said first set of intermediate functions includes:

$$s_I = \frac{1}{\sum_{j=1}^{N} w_j} \sum_{j=1}^{N} w_j I_j$$

$$s_{II} = \frac{1}{\sum_{j=1}^{N} w_j} \sum_{j=1}^{N} w_j I_j^2$$

$$s_V = \frac{1}{\sum_{j=1}^{N} w_j} \sum_{j=1}^{N} w_j V_j$$

$$s_{IV} = \frac{1}{\sum_{j=1}^{N} w_j} \sum_{j=1}^{N} w_j I_j V_j.$$

10. The method of claim 7, wherein said initial values include:

$S_w|_1 = Y_1$
$S_I|_1 = Y_1 I_1$
$S_{II}|_1 = Y_1 I_1^2$
$S_V|_1 = Y_1 V_1$
$S_{IV}|_1 = Y_1 I_1 V_1.$

11. The method of claim 7, wherein said recursive relationship includes:

$$s_w|_N = \sum_{j=1}^{N} w_j = \sum_{j=1}^{N} \gamma_j \lambda^{N-j} = \gamma_N + \lambda \sum_{j=1}^{N-1} \gamma_j \lambda^{N-1-j} = \gamma_N + \lambda(s_w|_{N-1})$$

$$s_I|_N = \frac{1}{\sum_{j=1}^{N} w_j} \sum_{j=1}^{N} w_j I_j = \frac{\gamma_N I_N + \lambda(s_I|_{N-1})(s_w|_{N-1})}{(s_w|_N)}$$

$$s_{II}|_N = \frac{1}{\sum_{j=1}^{N} w_j} \sum_{j=1}^{N} w_j I_j^2 = \frac{\gamma_N I_N^2 + \lambda(s_{II}|_{N-1})(s_w|_{N-1})}{(s_w|_N)}$$

$$s_V|_N = \frac{1}{\sum_{j=1}^{N} w_j} \sum_{j=1}^{N} w_j V_j = \frac{\gamma_N V_N + \lambda(s_V|_{N-1})(s_w|_{N-1})}{(s_w|_N)}$$

$$s_{IV}|_N = \frac{1}{\sum_{j=1}^{N} w_j} \sum_{j=1}^{N} w_j I_j V_j = \frac{\gamma_N I_N V_N + \lambda(s_{IV}|_{N-1})(s_w|_{N-1})}{(s_w|_N)}.$$

12. The method of claim 7, including applying a skewness test before said method is performed.

13. The method of claim 12, wherein said skewness test includes the steps of:

defining a second set of intermediate functions, wherein each of said second set of intermediate functions is expressed in a recursive form based on an immediate prior state in time;

assigning initial values to said second set of intermediate function;

applying said skewness test based upon said second set of intermediate functions; and determining a result of said skewness test.

14. The method of claim 13, wherein said second set of intermediate functions includes:

$$s_{w,s}|_N = \sum_{j=1}^{N} \lambda^{N-j} = 1 + \lambda \sum_{j=1}^{N-1} j \lambda^{N-1-j} = 1 + \lambda(s_{w,s}|_{N-1})$$

$$s_{I,s}|_N = \frac{1}{\sum_{j=1}^{N} \lambda^{N-j}} \sum_{j=1}^{N} \lambda^{N-j} I_j = \frac{I_N + \lambda(s_{I,s}|_{N-1})(s_{w,s}|_{N-1})}{(s_{w,s}|_N)}$$

$$s_{II,s}|_N = \frac{1}{\sum_{j=1}^{N} \lambda^{N-j}} \sum_{j=1}^{N} \lambda^{N-j} I_j^2 = \frac{I_N^2 + \lambda(s_{I,sI}|_{N-1})(s_{w,s}|_{N-1})}{(s_{w,s}|_N)}.$$

15. The method of claim 7 including computing a recursive power expression based on said data points.

16. The method of claim 15, wherein said power expression is a max discharge and charge power of said battery system.

17. The method of claim 16, wherein said power expression is:

$$P_{max,discharge} = IV_{min}$$
$$= \left[\frac{(V_0 - V_{min})_t + \exp(-B\Delta t)[V - (V_0 - IR)]_{t-\Delta t}}{R + A\Delta t}\right]V_{min}, \text{ and}$$
$$P_{max,charge} = IV_{max}$$
$$= \left[\frac{(V_0 - V_{max})_t + \exp(-B\Delta t)[V - (V_0 - IR)]_{t-\Delta t}}{R + A\Delta t}\right]V_{max}.$$

18. A vehicle powertrain control system, comprising:
a battery pack;
a power inverter coupled to said battery pack;
a controller controlling said power inverter, said controller monitoring a state of charge (SOC) of said battery pack; and
a program product for computing a resistance and an open circuit voltage both being functionally related to said SOC, said program product being associated to said controller.

19. The vehicle powertrain control system of claim 18, wherein said battery pack comprises lead acid batteries.

20. The vehicle powertrain control system of claim 18, wherein said battery pack comprises nickel/metal hydride (NiMH) batteries.

21. The vehicle powertrain control system of claim 18, wherein said battery pack comprises lithium ion batteries.

* * * * *